United States Patent [19]

DeVeirman

[11] Patent Number: 5,235,540
[45] Date of Patent: Aug. 10, 1993

[54] PARASITIC INSENSITIVE PROGRAMMABLE BIQUADRATIC PULSE SLIMMING TECHNIQUE

[75] Inventor: Geert DeVeirman, Irvine, Calif.

[73] Assignee: Silicon Systems, Inc., Tustin, Calif.

[21] Appl. No.: 516,717

[22] Filed: Apr. 26, 1990

[51] Int. Cl.$^5$ .............................................. G06G 7/02
[52] U.S. Cl. ..................................... 364/825; 360/46
[58] Field of Search ...................... 360/45, 46; 323/315, 323/317, 316; 331/135; 330/277, 253, 51, 107, 109; 340/347 AD; 307/491, 490; 332/17; 364/825

[56] References Cited

U.S. PATENT DOCUMENTS

| | | | |
|---|---|---|---|
| 3,995,235 | 11/1976 | Kaplan | 332/17 |
| 4,264,935 | 4/1981 | Lee | 360/46 |
| 4,371,900 | 2/1983 | Huber | 360/46 |
| 4,388,539 | 6/1983 | Boeke | 307/491 |
| 4,853,802 | 8/1989 | Kukson | 360/46 |
| 4,947,141 | 8/1990 | Atkinson et al. | 331/135 |
| 4,953,041 | 8/1990 | Huber | 360/46 |
| 4,973,915 | 11/1990 | Batey | 360/46 |
| 5,182,522 | 1/1993 | Tanigawa et al. | 330/107 |
| 5,189,321 | 2/1993 | Seevinck | 307/490 |

FOREIGN PATENT DOCUMENTS 0189347 1/1986 European Pat. Off. .
2200007 12/1987 United Kingdom .

Primary Examiner—Jerry Smith
Assistant Examiner—Jim Trammell
Attorney, Agent, or Firm—Hecker & Harriman

[57] ABSTRACT

A filter circuit with improved performance characteristics. A biquadratic transconductance-C filter includes a differentiator in the feed forward path of the input signal to compensate for the non-ideal operation of the transconductance elements and to simplify the performance requirements of a variable gain amplifier also in the feed forward path. The variable gain amplifier and feed forward technique are used to create two programmable magnitude, opposite sign zeros on the real axis, whose effect on the incoming data signal results in variable pulse slimming. The addition of a differentiator in the feed forward path eliminates the effect of the output admittance of the transconductance elements on the filter's group delay. The differentiator acts as a first order, high pass filter. The frequency of the differentiator is controlled so that the input signal is attenuated before it is provided to the variable gain amplifier. This reduces the dynamic range requirements of the variable gain amplifier without affecting group delay requirements.

15 Claims, 4 Drawing Sheets

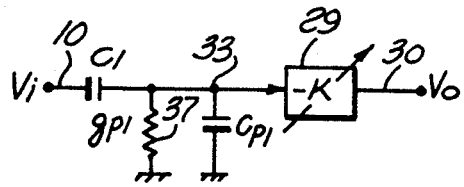
FIG. 5a (RC representation)
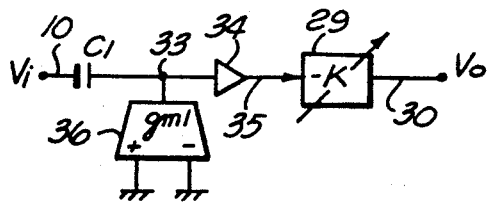
FIG. 5b (actual implementation)
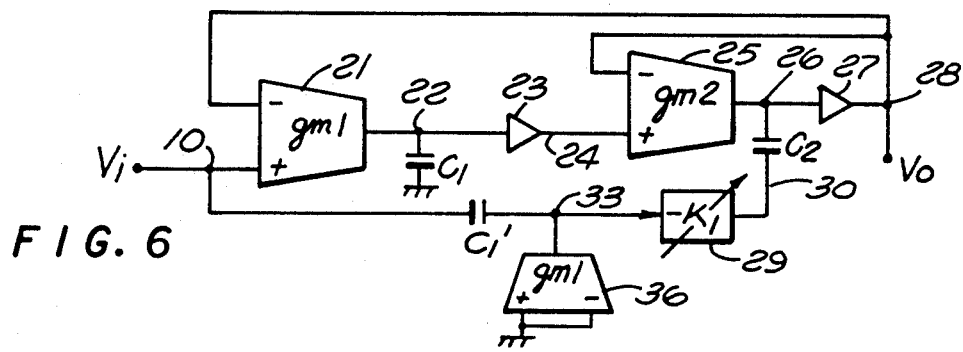
FIG. 6
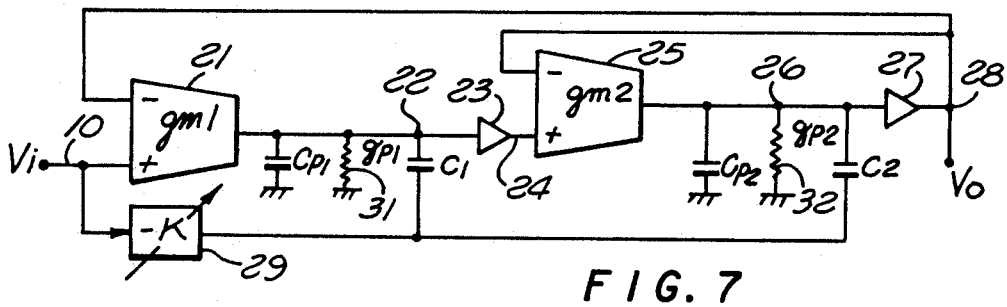
FIG. 7
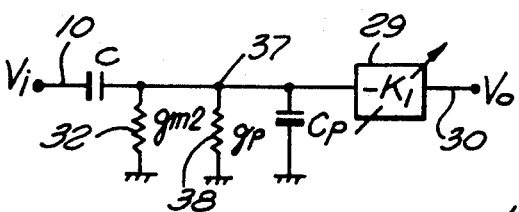
FIG. 8a (RC realization)
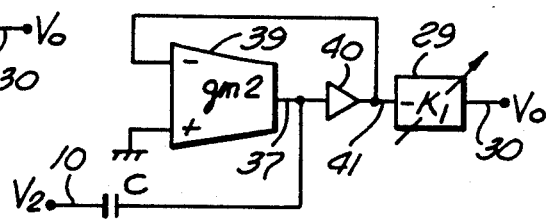
FIG. 8b (Actual circuit)

PARASITIC INSENSITIVE PROGRAMMABLE BIQUADRATIC PULSE SLIMMING TECHNIQUE

BACKGROUND OF THE INVENTION

1. Field of the Invention

This invention relates to the field of filters having tunable pole frequencies.

2. Background Art

Many signal processing applications require filters that can operate at high signal rates with a minimum of delay variation. For example, certain disk drive applications, such as constant density recording disk drive schemes, require Bessel-type low pass filters to handle data rates up to 24 megabits per second. These applications generally use continuously tunable pole frequencies ($F_0$) of up to 13 megahertz. The applications often require less than one nanosecond group delay deviation between DC and $F_0$. Such applications often also require programmable high frequency boost (commonly known as pulse slimming).

In the prior art, high order filters are realized by cascading second order building blocks (biquads). Pulse slimming can then be theoretically realized by subtracting the output of a variable gain, high pass biquad from its matched low pass counterpart. To accomplish this, the filters must have identical poles in the S plane. One prior art filter is illustrated in FIG. 1. An input voltage, $V_I$ 10 is provided to a low pass filter 11 and to a variable gain amplifier 15. The output 12 of low pass filter 11 is voltage $V_{LP}$ and is coupled to summing node 13. The output 16 of variable gain amplifier 15 is provided to high pass filter 17. The output 18 of high pass filter 17, $V_{HP}$, is provided to an inverting node of summing node 13 so that the output of the high pass filter is subtracted from the output of the low pass filter. The output 14 of node 13 is the output voltage $V_0$.

Using standard equations for second order filters, phase and group delay can be calculated for the circuit of FIG. 1 as follows:

$$T_{LP} = \frac{V_{LP}}{V_i} = \frac{\omega_0^2}{s^2 + s\frac{\omega_0}{Q_0} + \omega_0^2} \Bigg\} \quad \text{(Equation 1)}$$

$$T_{HP} = \frac{V_{HP}}{V_i} = \frac{Ks^2}{s^2 + s\frac{\omega_0}{Q_0} + \omega_0^2} \Bigg\} \to T_S =$$

$$\frac{V_o}{V_i} = \frac{\omega_0^2 - Ks^2}{s^2 + s\frac{\omega_0}{Q_0} + \omega_0^2}$$

with $s = j\omega$, phase and group delay, respectively, given by:

$$\phi_T(\omega) = \arctan\left[\frac{Im(T(\omega))}{Re(T(\omega))}\right], \quad GDL_T(\omega) = -\frac{d\phi_T(\omega)}{d\omega}$$

one finds from Equation 1:

$$GDL_{LP}(\omega) = GDL_{HP}(\omega) = GDL_S(\omega) = \quad \text{(Equation 2)}$$

-continued $$\frac{\frac{\omega_0^3}{Q_0} + \frac{\omega^2\omega_0}{Q_0}}{(\omega_0^2 - \omega^2)^2 + (\omega\omega_0/Q_0)^2}$$

Monolithic high frequency biquads are typically based on transconductances and capacitors. An ideal transconductance is a circuit element that converts an input voltage (or voltage difference) into an output current. FIG. 2 illustrates an ideal transconductance element. A positive voltage $V+$ and a negative voltage $V-$ are provided at the positive and negative inputs of a transconductance element 19. The transconductance element 19 provides an output current 20, $I_0$. The circuit of FIG. 2 is described by the equation $I_0 = GM(V+ - V-)$.

Ideal transconductances are assumed to have infinite input and output impedances (zero admittances). A typical state variable transconductance-C Biquad is illustrated in FIGS. 3a and 3b.

Referring to FIG. 3a, a first transconductance element 21 receives input voltage 10 $V_i$ at its positive input. The output of transconductance 21 at node 22 is coupled through capacitor C1 to ground. Node 22 is also coupled to buffer 23. Buffer 23 may be a level shifter. The output 24 of buffer 23 is provided to the positive input of a second transconductance element 25. The output of the transconductance element 25 at node 26 is coupled through capacitor C2 to ground and to the input of buffer 27. The output of buffer 27 at node 28 is voltage $V_{LP}$. This voltage $V_{LP}$ is coupled in a feedback loop to the negative input terminal of transconductance element 25 and the negative input terminal of transconductance element 21.

Analysis of the circuit in FIG. 3a results in:

$$\frac{V_{LP}}{V_i} = \frac{g_{m1}g_{m2}/C_1C_2}{s^2 + s\frac{g_{m2}}{C_2} + \frac{g_{m1}g_{m2}}{C_1C_2}} \to \quad \text{(Equation 3)}$$

$$\begin{cases} \omega_0 = \sqrt{\frac{g_{m1}g_{m2}}{C_1C_2}} \\ Q_0 = \sqrt{\frac{g_{m1}}{g_{m2}}} \cdot \sqrt{\frac{C_2}{C_1}} \end{cases}$$

The circuit of FIG. 3a can be implemented in an integrated circuit. However, there may be matching problems when implementing separate low pass and high pass functions. Matching problems can be eliminated by combining the low pass and high pass functions as in the circuit of FIG. 3b. This is accomplished by removing capacitor C2 from ground and feeding the input signal forward through an internal circuit node. The input voltage 10 $V_i$ is provided to the positive input of transconductance element 21 and to variable gain amplifier 29. The output 30 of variable gain amplifier 29 is provided to one terminal of capacitor C2. The other terminal of capacitor C2 is coupled to node 26 (the output of transconductance element 25). The circuit of FIG. 3b can be described as follows:

$$\frac{V_0}{V_i} = \frac{\frac{g_{m1}g_{m2}}{C_1 C_2} - Ks^2}{s^2 + s\frac{g_{m2}}{C_2} + \frac{g_{m1}g_{m2}}{C_1 C_2}} \quad \text{(Equation 4)}$$

The circuits of FIGS. 3a and 3b are accurate models when dealing with ideal transconductances. However, physical transconductance elements are not ideal and have non-zero input and output admittances, creating a parasitic conductance and parasitic capacitance in parallel with each load capacitor as shown in FIG. 4. The circuit of FIG. 4 is substantially the same as the circuit of FIG. 3b with the addition of a parasitic conductance 31 coupled to node 22 and a parasitic capacitance $C_{P1}$ coupled in parallel to node 22. In addition, the second transconductance 25 has an associated parasitic conductance 32 and parasitic capacitance $C_{P2}$ coupled in parallel to node 26. Transconductance element 21 has an associated output admittance represented by $g_{o1}$ and $C_{o1}$ and the second transconductance element 25 has an associated output admittance $g_{o2}$ and $C_{o2}$. The buffers 23 and 27 have input admittances represented by $g_{IB}$ and $C_{IB}$.

The parasitic conductance and capacitance at nodes 22 and 26 are given by the following:

$$\begin{cases} g_{p1} = g_{o1} + g_{ib} \\ C_{p1} = C_{o1} + C_{ib} \end{cases} \quad \begin{cases} g_{p2} = g_{o2} + g_{ib} \\ C_{p2} = C_{o2} + C_{ib} \end{cases}$$

or, in case the stages are directly coupled without buffer, $$\begin{cases} g_{p1} = g_{o1} + g_{i2} \\ C_{p1} = C_{o1} + C_{i2} \end{cases} \quad \begin{cases} g_{p2} = g_{o2} + g_{i2} + g_{i1} \\ C_{p2} = C_{o2} + C_{i2} + C_{i1} \end{cases}$$

It should be mentioned that in nearly all practical situations, $g_o$ and $C_o$ dominate.

When these parasitics are included, the transfer function for FIG. 4 is:

$$\frac{V_0}{V_i} = \frac{g_{m1}g_{m2} - KC_2 g_{p1}s - KC_2(C_1 + C_{p1})s^2}{s^2(C_1 + C_{p1})(C_2 + C_{p2}) + s[(C_1 + C_{p1})(g_{m2} + g_{p2}) + (C_2 + C_{p2})g_{p1}] + g_{m1}g_{m2} + g_{m2}g_{p1} + g_{p1}g_{p2}} \quad \text{(Equation 5)}$$

Due to the s-term introduced in the numerator, the biquad's group delay is no longer independent of K. By rewriting the previous equation in its standard form, $$\frac{V_0}{V_i} = A \cdot \frac{-Ks^2 - Ks\frac{\omega_z}{Q_z} + \omega_z^2}{s^2 + s\frac{\omega_p}{Q_p} + \omega_p^2} \quad \text{(Equation 6)}$$

$$\omega_p = \sqrt{\frac{g_{m1}g_{m2} + g_{m2}g_{p1} + g_{p1}g_{p2}}{(C_1 + C_{p1})(C_2 + C_{p2})}} \quad \omega_z = \sqrt{\frac{g_{m1}g_{m2}}{C_2(C_1 + C_{p1})}}$$

$$A = \frac{C_2}{C_2 + C_{p2}}$$

$$Q_p = \frac{\sqrt{g_{m1}g_{m2} + g_{m2}g_{p1} + g_{p1}g_{p2}} \sqrt{(C_1 + C_{p1})(C_2 + C_{p2})}}{(C_1 + C_{p1})(g_{m2} + g_{p2}) + (C_2 + C_{p2})g_{p1}}$$

$$Q_z = \sqrt{\frac{C_1 + C_{p1}}{C_2}} \cdot \sqrt{\frac{g_{m1}g_{m2}}{g_{p1}}}$$

the section's group delay can now be expressed as:

$$GDL = \frac{\omega_p^3/Q_p + \omega^2\omega_p/Q_p}{(\omega_p^2 - \omega^2)^2 + (\omega\omega_p/Q_p)^2} + \frac{K\omega_z^3/Q_z - K^2\omega^2\omega_z/Q_z}{(\omega_z^2 + K\omega^2)^2 + (K\omega\omega_z/Q_z)^2} \rightarrow$$

delay of regular LP section     error introduced by slimming
$E_{GDL} = f(\omega, K)$ $$E_{GDL}(o, K) = \frac{K}{\omega_z Q_z} = \frac{Kg_{p1}C_2}{g_{m1}g_{m2}}$$

$$E_{GDL}(\omega_z, K) = \frac{K(1 - K)Q_z}{\omega_z[Q_z^2(1 + K)^2 + K^2]} =$$

$$E_{GDL}(o, K) \cdot \frac{(1 - K)Q_z^2}{Q_z^2(1 + K)^2 + K^2}$$

$$E_{GDL}(\omega_z, K) = E_{GDL}(o, K)\frac{1 - K}{(1 + K)^2} \quad \text{(for } Q_z >> 1\text{)}$$

A numerical example, representative for an actual design, shows that the error is often unacceptably high.

$K = 5 \quad \rightarrow \quad E_{GDL}(o, K) = 1.8 \text{ ns}$ $g_{p1} = 4 \cdot 10^{-5} \text{ S} \quad E_{GDL}(\omega_z, K) = -0.2 \text{ ns}$ $C_2 = 5 \text{ pF} \quad \Delta GDL = E_{GDL}(o, K) - E_{GDL}(\omega_z, K) \approx 2 \text{ ns}$ $g_{m1} = 1.4 \text{ mS}$ $g_{m2} = 0.4 \text{ mS}$ Filter implementations are further limited by the large dynamic range requirement of the variable gain amplifier. Typically, input signals are on the order of 1 $V_{pp}$ and desired gain factors of up to K=5 or more are desired. This requirement is hard to meet in 5 V only designs. Furthermore, gain amplifiers must be kept simple to avoid excess phase that can affect the filter's group delay and degrade performance.

Therefore, it is an object of the present invention to provide a filter and pulse slimmer that compensates for transconductance element non-idealities.

It is another object of the present invention to provide a filter with adequate dynamic range and minimum group delay variation due to variable pulse slimming.

SUMMARY OF THE INVENTION

This invention provides a filter circuit with improved performance characteristics. A biquadratic transconductance-C filter includes a differentiator in the feed forward path of the input signal to compensate for the non-ideal operation of the transconductance elements and to simplify the performance requirements of a variable gain amplifier also in the feed forward path. The variable gain amplifier and feed forward technique are used to create two programmable magnitude, opposite sign zeros on the real axis, whose effect on the incoming data signal results in variable pulse slimming. The addition of a differentiator in the feed forward path eliminates the effect of the output admittance of the transconductance elements on the filter's group delay. The differentiator acts as a first order, high pass filter. The frequency of the differentiator is controlled so that the input signal is attenuated before it is provided to the variable gain amplifier. This reduces the dynamic range requirements of the variable gain amplifier without affecting group delay requirements.

BRIEF DESCRIPTION OF THE DRAWINGS

FIG. 5a is a circuit diagram of a differentiator for use in the preferred embodiment of the present invention.

FIG. 5b is a circuit diagram of the implementation of the differentiator of FIG. 5a.

FIG. 6 is a circuit diagram of the preferred embodiment of the present invention.

FIG. 7 is an alternate embodiment of the circuit of FIG. 4.

FIG. 8a is a circuit diagram of a differentiator for use in the circuit of FIG. 7. FIG. 8b is a circuit diagram of the implementation of the circuit of FIG. 8a.

DETAILED DESCRIPTION OF THE INVENTION

Figure 1:
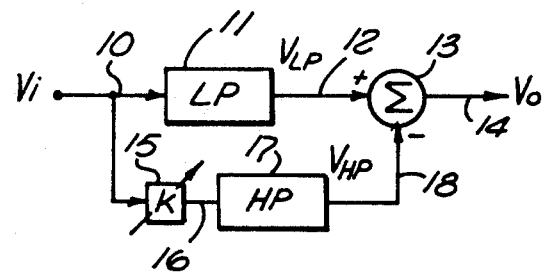
FIG. 1 is a circuit diagram of a prior art filter.
Figure 2:
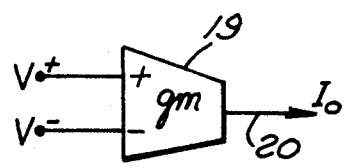
FIG. 2 is a diagram of an ideal transconductance element.
Figure 3A:
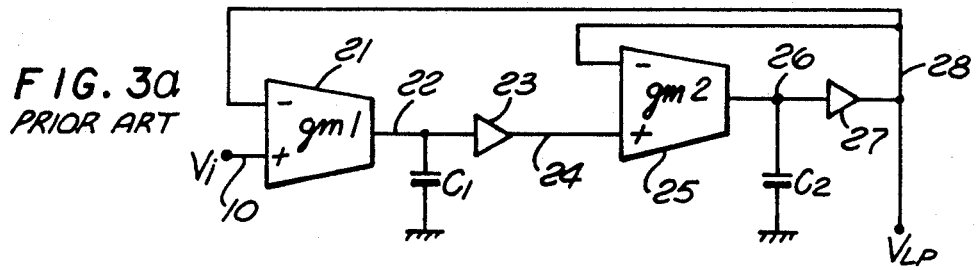
FIG. 3a is a circuit diagram of a prior art state variable transconductance-C biquad.
Figure 3B:
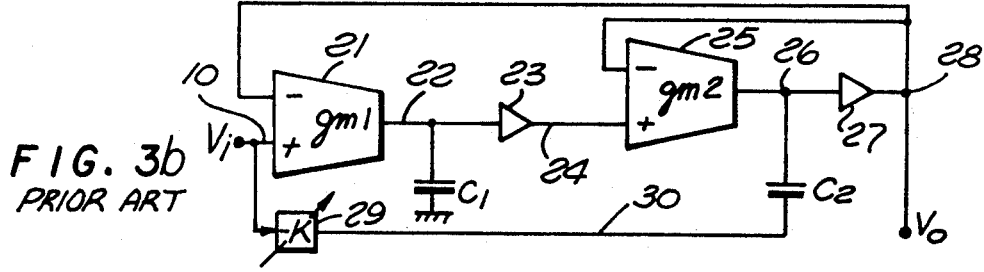
FIG. 3b is an alternate prior art embodiment of the circuit of FIG. 1 comprising the circuit of FIG. 3A and a feed forward path to realize zeros.

This invention relates to an improved filter resulting in parasitic insensitive programmable biquadratic pulse slimming. In the following description, numerous specific details are set forth in order to provide a more thorough description of the present invention. It will be apparent, however, to one skilled in the art, that the invention can be practiced without these specific details. In other instances, well known features have not been described in detail so as not to unnecessarily obscure the present invention.

CANCELLATION OF OUTPUT CONDUCTANCE

Referring to Equation 5, the group delay problem can be solved when implementing the following transfer function in the feed forward path of the input voltage:

$$-K = \frac{-sK_1C_1}{s(C_1 + C_{p1}) + g_{p1}} \quad \text{(Equation 7)}$$

The transfer function of Equation 7 is the transfer function of a lossy differentiator. A lossy differentiator is one that has a finite gain for s approaching infinity. Such a differentiator is illustrated in FIG. 5a. The input voltage 10 $V_i$ is provided to one terminal of capacitor $C_1$. The other terminal of capacitor $C_1$ is coupled to node 33. Node 33 is coupled through parasitic conductance $g_{p1}$ 37 and parasitic capacitance $C_{p1}$ in parallel to ground. Node 33 is also coupled to the input of variable gain amplifier 29. Variable gain amplifier 29 provides an output 30 $V_0$.

The actual implementation of the differentiator of FIG. 5a is illustrated in FIG. 5b. The input voltage 10 $V_i$ is coupled to one terminal of capacitor $C_1$. The other terminal of capacitor $C_1$ is coupled to node 33. Node 33 is coupled to the output of transconductance element 36. The positive and negative inputs of transconductance elements 36 are coupled to ground. Node 33 is coupled through buffer 34 to variable gain amplifier 29. Amplifier 29 provides an output 30 $V_0$.

The filter circuit of the preferred embodiment of the present invention is illustrated in FIG. 6. Input voltage 10 $V_i$ is provided to the positive input of transconductance element 21. The output of transconductance element 21 at node 22 is coupled through capacitor $C_1$ to ground. Node 22 is also coupled to buffer 23. The output 24 of buffer 23 is coupled to the positive input of transconductance element 25. The output of transconductance element 25 at node 26 is coupled to buffer 27. The output of buffer 27 at node 28 is voltage $V_0$. $V_0$ is coupled in a feedback loop to the negative input of transconductance elements 21 and 25, respectively.

The input voltage 10 $V_i$ is also coupled in a feed forward loop to capacitor $C_{1'}$. Capacitor $C_{1'}$ at node 33 is coupled to output of transconductance element 36. The positive and negative inputs of transconductance element 36 are coupled to ground. In the preferred embodiment of the present invention, the capacitance of capacitor $C_{1'}$ matches the capacitance of capacitor $C_1$. In addition, the transconductance of transconductance element 36 matches the transconductance of input transconductance element 21. Node 33 is also coupled to buffer 34. The output 35 of buffer 34 is coupled to the input of variable gain amplifier 29. The output 30 of variable gain amplifier 29 is coupled through capacitor $C_2$ to node 26.

The transfer function of the circuit of FIG. 6 is given by the following:

$$\frac{V_0}{V_i} = \frac{g_{m1}g_{m2} - s^2K_1C_1C_2}{s^2(C_1 + C_{p1})(C_2 + C_{p2}) + s[(C_1 + C_{p1})(g_{m2} + g_{p2}) + (C_2 + C_{p2})g_{p1}] + g_{m1}g_{m2} + g_{m2}g_{p1} + g_{p1}g_{p2}} \quad \text{(Equation 8)}$$

The cancellation of the parasitic conductance and capacitance is achieved by matching the capacitor $C_1$ and $C_{1'}$ and the conductances of transconductance elements 21 and 36. Even in case of realistic mismatches between these like components on the same chip, significant improvement over prior art is achieved.

The feed forward differentiator acts as a first order high pass filter. The −3dB frequency of the filter is given by:

$$f_{-3dB} = \frac{1}{2\pi} \cdot \frac{g_{p1}}{C_1 + C_{p1}}$$

The frequency value of the feed forward differentiator is less than the signal frequencies typically encountered in the filter circuit. As a result, the input signal is nearly full scale when it is provided to the variable gain amplifier 29. Thus, the same dynamic range problems are presented for the differentiator as in the prior art. However, this problem can be solved by increasing the −3dB frequency of the feed forward differentiator.

Figure 4:
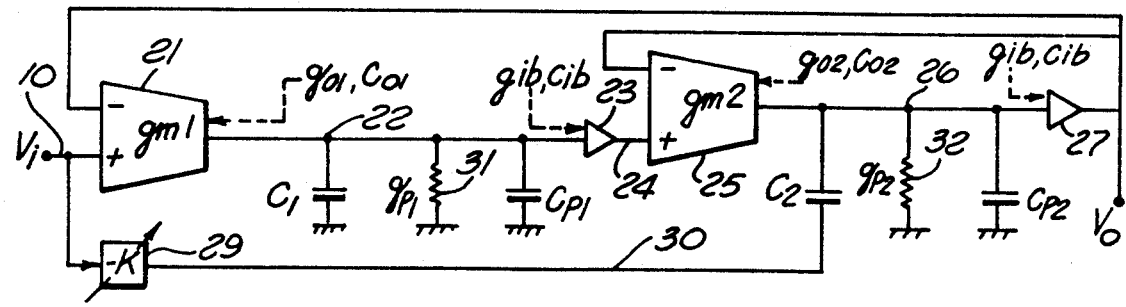
FIG. 4 is a circuit diagram illustrating parasitic capacitance and conductance of the circuit of FIG. 3b.

FIG. 7 illustrates the filter of FIG. 4 with the output of the amplifier 29 coupled to both capacitor $C_1$ and $C_2$. The output of the circuit of FIG. 7 can be described as follows:

$$\frac{V_0}{V_i} = \frac{g_{m1}g_{m2} - sKC_1g_{m2} - sKC_2(g_{p1} + sC_1 + sC_{p1})}{s^2(C_1 + C_{p1})(C_2 + C_{p2}) + s[(C_1 + C_{p1})(g_{m2} + g_{p2}) + (C_2 + C_{p2})g_{p1}] + g_{m1}g_{m2} + g_{m2}g_{p1} + g_{p1}g_{p2}} \quad \text{(Equation 9)}$$

If one chooses $C_1=C_2=C$, and furthermore $g_{p1}=g_{p2}=g_p$ and $C_{p1}=C_{p2}=C_p$, Equation 9 can be simplified to:

$$\frac{V_0}{V_i} = \quad \text{(Equation 10)}$$

$$\frac{g_{m1}g_{m2} - sKC[g_{m2} + g_p + sC + sC_p]}{s^2(C + C_p)^2 + s(C + C_p)(g_{m2} + 2g_p) + g_{m1}g_{m2} + g_{m2}g_p + g_p^2}$$

The K dependence of the group delay can now be cancelled by replacing K by a block:

$$-K = \frac{-sK_1C}{g_{m2} + g_p + sC + sC_p} \quad \text{(Equation 11)}$$

The transfer function of Equation 11 can be implemented by the circuit of FIG. 8a. The input voltage 10 $V_i$ is coupled to one terminal of capacitor C. The other terminal of capacitor C is coupled to node 37. A parasitic conductance 38 and a parasitic capacitance $C_p$ are coupled in parallel to node 37 and to ground. A conductance 32 equivalent to the transconductance of transconductance element 25 is coupled to node 37 and to ground. Node 37 is coupled to the input of variable gain amplifier 29. The amplifier 29 provides an output voltage 30 $V_o$.

The circuit of FIG. 8a can be implemented by the circuit of FIG. 8b. The input voltage 10 $V_i$ is provided to capacitor C. The output of capacitor C is coupled at node 37 to the output of transconductance element 39. The positive input of transconductance element 39 is grounded. Node 37 is also coupled to buffer 40. The output 41 of buffer 40 is coupled in a feedback loop to the negative input of transconductance element 39. The output 41 is also coupled to the input of variable gain amplifier 29 that provides output 30 $V_0$.

Figure 9:
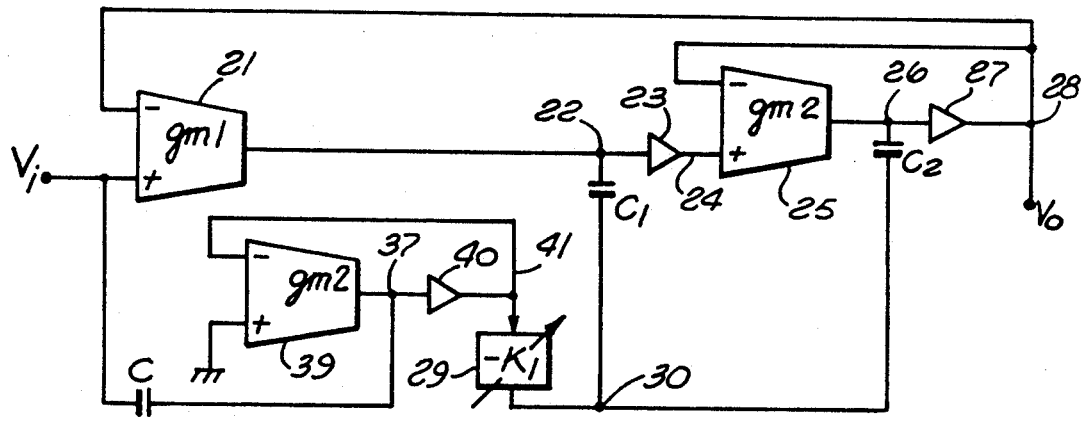
FIG. 9 is the circuit of FIG. 7 implementing the circuit of FIG. 8b.

This differentiator element can be implemented in the filter of this invention as illustrated in FIG. 9. The input voltage 10 $V_i$ is coupled to the positive input of transconductance element 21 and capacitor C. The output of transconductance element 21 at node 22 is coupled to buffer 23 and to one terminal of capacitor $C_1$. The output 24 of buffer 23 is coupled to the positive input of transconductance element 25. The output of transconductance element 25 at node 26 is coupled to buffer 27 and one terminal of capacitor $C_2$. The output of buffer 27 at node 28 is output voltage $V_0$. Voltage $V_0$ is coupled in a feedback loop to the negative inputs of transconductance elements 21 and 25, respectively.

The capacitor C is also coupled to the output of transconductance element 39. The positive input of transconductance element 39 is coupled to ground. The output of transconductance element 39 at node 37 is coupled to buffer 40. the output 41 of buffer 40 is coupled to the input of variable gain amplifier 29 and in a feedback loop to the negative input of transconductance element 39. The output of variable gain amplifier 29 at node 30 is coupled to capacitor $C_1$ and $C_2$. The transconductance of transconductance element 39 should substantially match that of transconductance element 25. In addition, the capacitors C, $C_1$ and $C_2$ should be substantially matching capacitors in this embodiment of the invention.

The transfer function of the circuit of FIG. 9 is given by:

$$\frac{V_0}{V_i} = \quad \text{(Equation 12)}$$

$$\frac{g_{m1}g_{m2} - s^2K_1C^2}{s^2(C + C_p)^2 + s(C + C_p)(g_{m2} + 2g_p) + g_{m1}g_{m2} + g_{m2}g_p + g_p^2}$$

The differentiator highpass −3 dB frequency is given by:

$$f_{-3dB} = \frac{1}{2\pi} \cdot \frac{g_{m2} + g_p}{C + C_p} \quad \text{(Equation 13)}$$

Conductance $g_{m2}$ is much greater than $g_p$. Therefore, the frequency at −3 decibels of the circuit of FIG. 8b is greater than the frequency at −3 decibels of the circuit of FIG. 5b, and typically higher than the signal frequencies. This attenuates the signal provided to the input of gain amplifier 29, relaxing the dynamic range requirements of the amplifier. The matching requirements are now dominated by the transconductances of transconductance elements 21, 25 and 39 which can be matched and controlled with precision in integrated circuit technology.

ALTERNATE EMBODIMENTS

Figure 10:
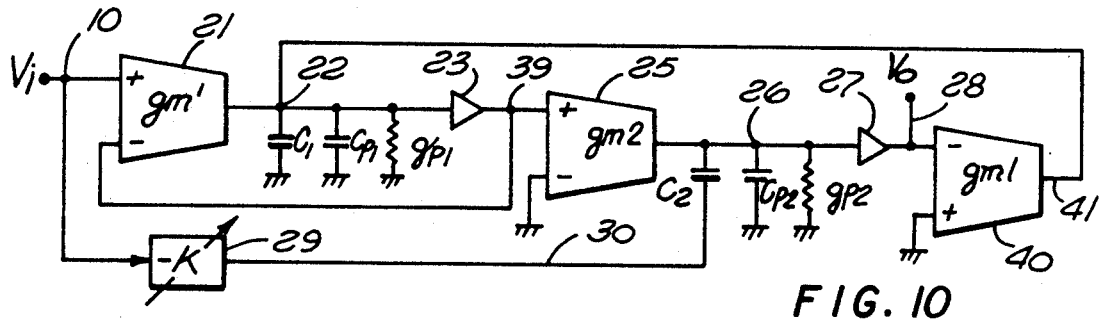
FIG. 10 is circuit diagram of a gyrator-based filter circuit.

The present invention can also be utilized in a gyrator-based circuit such as that illustrated in FIG. 10. The input voltage 10 $V_i$ is coupled to the positive input of transconductance element 21 and to variable gain amplifier 29. The output of transconductance element at node 22 is coupled through parasitic conductance gp1, parasitic capacitance $C_{p1}$ and capacitor $C_1$ in parallel to ground. Node 22 is also coupled to buffer 23. The output of buffer 23 at node 39 is coupled in a feedback loop to the negative input of transconductance element 21. Node 39 is also coupled to the positive input of transconductance element 25. The negative input of transconductance element 25 is coupled to ground.

The output 30 of gain amplifier 29 is coupled to one terminal of capacitor $C_2$. The other terminal of capacitor $C_2$ is coupled to node 26, the output of transconductance element 25. Node 26 is coupled through parasitic capacitance $C_{p2}$ and parasitic conductance $g_{p2}$ in parallel to ground. Node 26 is also coupled to buffer 27. The output 28 of buffer 27 is voltage $V_0$. This voltage is coupled to the negative input of transconductance element 40. The positive input of transconductance element 40 is coupled to ground. The output 41 of transconductance element 40 is coupled in a feedback loop to node 22. The transfer function of this circuit is given by:

$$\frac{V_0}{V_i} = \frac{g_{m1}g_{m2} - KsC_2(sC_1 + sC_{p1} + g_{p1} + g_{m1})}{s^2(C_1 + C_{p1})(C_2 + C_{p2}) + s((C_1 + C_{p1})g_{p2} + (C_1 + C_{p1})(g_{p1} + g_{m1})) + g_{m1}g_{m2} + g_{p2}g_{m2} + g_{p1}g_{p2}} \quad \text{(Equation 14)}$$

choose:

$$-K = \frac{K_1 sC_1}{sC_1 + sC_{p1} + g_{p1} + g_{m1}} \quad \text{(Equation 15)}$$

Figure 11:
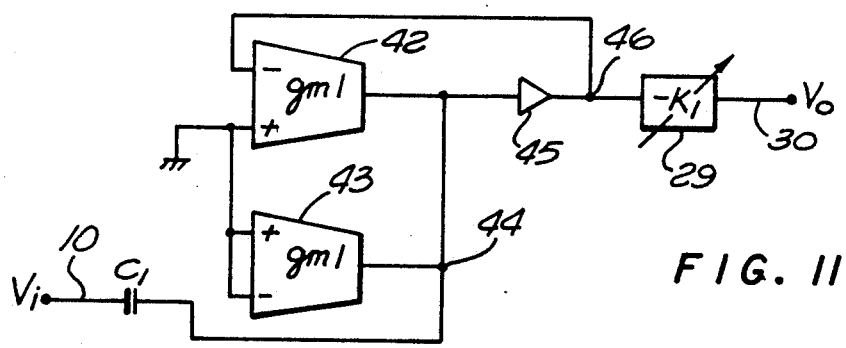
FIG. 11 is a circuit diagram of a differentiator for use in the circuit of FIG. 10.

The circuit of FIG. 11 can be utilized to implement the transfer function K. The input voltage 10 $V_i$ is provided to capacitor $C_1$. The other terminal of capacitor $C_1$ is coupled to the outputs of transconductance elements 42 and 43, respectively, at node 44. Node 44 is coupled to buffer 45. The output of buffer 45 at node 46 is provided as an input to variable gain amplifier 29' and in a feedback loop to the negative input of transconductance element 42. The output 30 of variable gain amplifier 29' is voltage $V_0$. The positive input of transconductance element 42 and both inputs of transconductance element 43 are coupled to ground.

Figure 12:
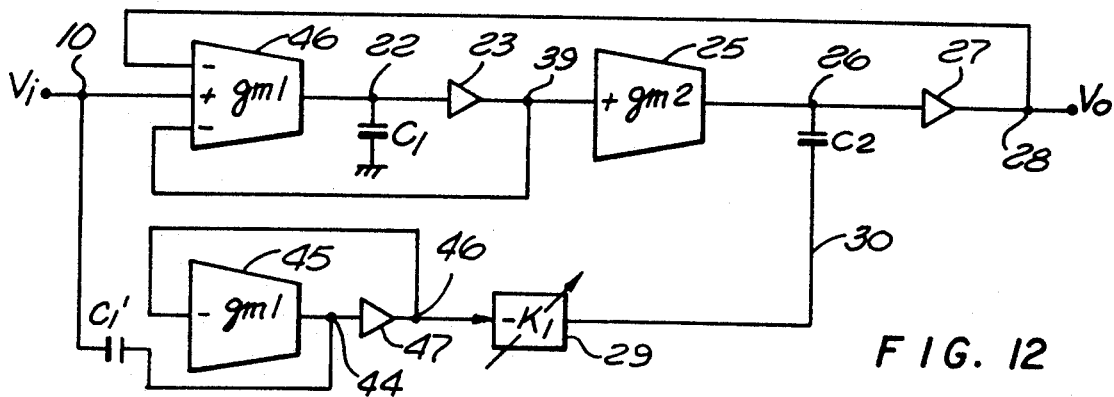
FIG. 12 is a circuit diagram illustrating the circuit of FIG. 10 combined with the differentiator of FIG. 11.

Transconductance elements 21 and 40 can be combined into a single transconductance element (as can transconductance elements 42 and 43), by utilizing techniques taught in U.S. patent application Ser. No. 497,863, filed on Mar. 22, 1990, and entitled BIPOLAR TUNABLE TRANSCONDUCTANCE ELEMENT abandon and assigned to the assignee of the present invention. The result is the circuit of FIG. 12. The input voltage 10 $V_i$ is provided to the positive input of transconductance element 46. Transconductance element 46 is the combination of transconductance elements 21 and 40 of FIG. 10. The output of transconductance element 46 at node 22 is coupled through capacitor $C_1$ to ground and to the input of buffer 23. The output of buffer 23 at node 39 is coupled in a feedback loop to one negative input of transconductance element 46. Node 39 is also coupled to the input of transconductance element 25. The output of transconductance element 25 at node 26 is coupled to the input of buffer 27. The output 28 of buffer 27 ($V_O$) is coupled in a feedback loop to the other negative input of transconductance element 46.

The input voltage 10 $V_i$ is also coupled through capacitor $C_1$' to the output of transconductance 45. Transconductance element 45 is the combination of transconductance elements 42 and 43 of FIG. 11. The output of transconductance element 45 at node 44 is coupled to buffer 47. The output of buffer 47 at node 46 is coupled in a feedback loop to the negative input of transconductance element 45 and to the input of variable gain amplifier 29. The output 30 of variable gain amplifier 29 is coupled through capacitor $C_2$ to node 26.

Figure 13:
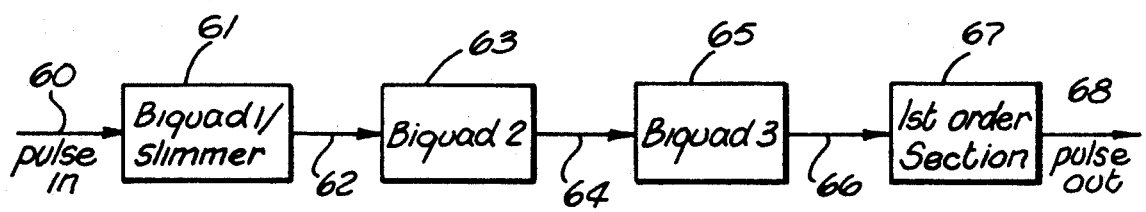
FIG. 13 is a block diagram of one application of the present invention.

The biquad/slimming filter of this invention may be used as part of a higher order filter for use in a read channel of a hard disk drive. The invention has particular application in a disk drive employing a constant density recording scheme. In such an application, a 7-pole bessel filter (having a maximally flat group delay) is used. A block diagram of such a filter is illustrated in FIG. 13. An incoming data pulse 60, such as from the read head of a disk drive, is provided to the first biquad slimmer block 61. The biquad slimmer block 61 is used to "slim" the input pulse to improve the accuracy of the read channel. The output 62 of the biquad slimmer block 61 is provided to second biquad 63 whose output 64 is provided to a third biquad 65. The output 66 of the third biquad block 65 is provided to a first order filter section 67 which produces the output pulse 68.

The filter of FIG. 13 is used to filter out high frequency noise and improve performance of a read channel or other signal processing channel. That is, the filter reduces error rate and increases the maximum achievable bit rates by providing a narrower pulse. Particularly in constant density recording disk drive schemes, pulse slimming is required.

The feedforward technique used in the biquad 1 slimmer block 61 creates two programmable magnitude, opposite sign zeros on the real axis of the S plane of the input signal. This results in high frequency boost (amplification of high frequency components in the input signal spectrum) and results in narrower data pulses (slimming).

Figure 14:
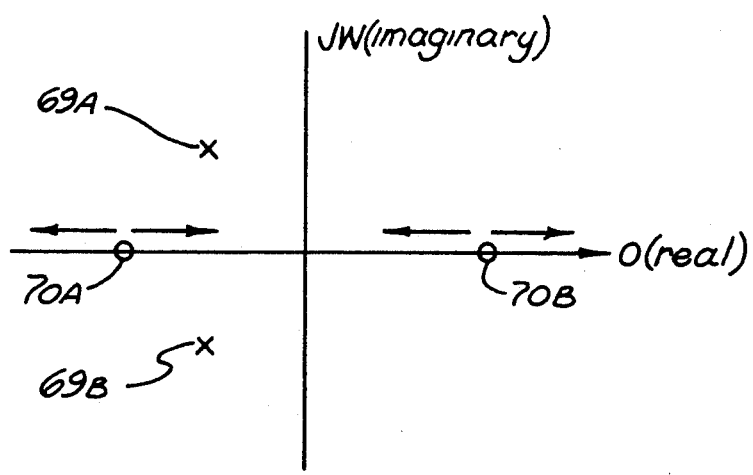
FIG. 14 is a pole zero diagram of a biquad/slimmer block using the present invention.

An example of an S plane is illustrated in FIG. 14. The S plane contains two axes, a real axis $\sigma$ and a perpendicular imaginary axis $J\omega$. The S plane is used to represent complex numbers as points. A complex number has both real and imaginary components. FIG. 14 is a pole zero diagram of the transfer function of the biquad slimmer block 61 of FIG. 13. The poles 69A and 69B are the points at which the denominator of the transfer function goes to zero. The zero points 70A and 70B on the real axis are the points at which the numerator of the transfer function goes to zero.

The transfer function has a pole at every value for which the response can exist in the absence of any source excitation. The zero is the point at which there is no response, regardless of the input signal.

The feedforward technique of this invention allows the zero points to be programmable, that is, zero points can be moved on the real axis without affecting the pole values. Parasitic output conductances will cause these zeros to move from their desired locations on the real axis (i.e., they are no longer real but have also an imaginary part). The compensation technique described here prevents this from happening.

Figure 15:
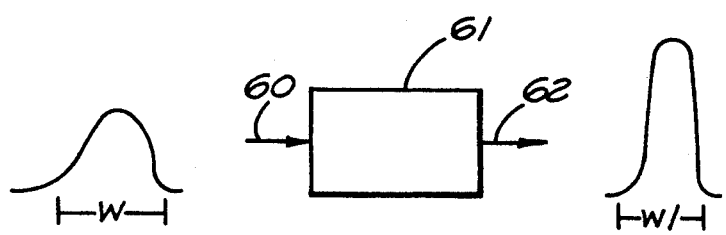
FIG. 15 is a signal diagram illustrating the effects of the biquad/slimming block of the present invention.

An example of the effect of the slimming block 61 on an input signal is illustrated in FIG. 15. The input signal 60 is a read data pulse with a width W. This input pulse 60 is provided to the slimming block 61 to provide output pulse 62 which has a width W' which is less than width W. By slimming the pulse, higher data bit rates can be achieved because intersymbol interference that can cause errors is reduced. In other words, individual pulses are easier to identify.

It is desired to keep the group delay variation in the filter at a minimum and that the group delay be independent of slimming effects. This requirement becomes more stringent at higher frequencies. The present invention eliminates these unwanted effects that can be caused by unavoidable circuit non-idealities and parasitics.

If the sign of the variable gain amplifier is reversed (to a $+K$ rather than $-K$) the transfer functions and techniques of this invention effect a notch filter with programmable transmission zeros where the zeros lie on the imaginary axis of the S plane. Notch filters implemented using this technique result in high Q factors. Ideally $Q_z = \infty$. In practice, $Q_z$ is finite due to parasitic output conductances of the transconductances. The parasitic compensation technique disclosed here increases this finite $Q_z$, and if perfect matching were achieved, $Q_z$ would be infinite regardless of the transconductance output conductance.

Thus, a parasitic insensitive programmable biquadratic pulse slimming filter has been described.

I claim:

1. A circuit comprising:
   a first transconductance element receiving an input signal, said first transconductance element providing a first output;
   a second transconductance element coupled to said first transconductance element for receiving said first output, said second transconductance element providing a second output coupled in a feedback loop to said first transconductance element and said second transconductance element;
   differentiating means coupled to said input signal, said differentiating means providing a third output coupled to said second output at a first node such that a fourth output signal is produced at said first node.

2. The circuit of claim 1 wherein said differentiating means comprises a variable gain amplifier.

3. The circuit of claim 2 wherein said variable gain amplifier has a transfer function given by:

$$-K = \frac{-sK_1C_1}{s(C_1 + C_{p1}) + g_{p1}}.$$

4. A circuit comprising:
   a first transconductance element receiving an input signal, said first transconductance element providing a first output at a first node;
   a second transconductance element coupled to said first transconductance element at said first node for receiving said first output, said second transconductance element providing a second output at a second node, said second node coupled in a feedback loop to said first transconductance element and said second transconductance element;
   differentiating means coupled to said input signal, said differentiating means providing a third output coupled to said second node through a first capacitor.

5. The circuit of claim 4 wherein said differentiating means comprises a variable gain amplifier.

6. The circuit of claim 5 wherein said variable gain amplifier has a transfer function given by:

$$-K = \frac{-sK_1C_1}{s(C_1 + C_{p1}) + g_{p1}}.$$

7. The circuit of claim 4 further including a second capacitor coupled between said first node and ground.

8. A circuit comprising:
   a first transconductance element receiving an input signal, said first transconductance element providing a first output at a first node;
   a second transconductance element coupled to said first transconductance element at said first node for receiving said first output, said second transconductance element providing a second output at a second node, said second node coupled in a feedback loop to said first transconductance element and said second transconductance element;
   differentiating means coupled to said input signal, said differentiating means providing a third output coupled to said first node through a first capacitor and to said second node through a second capacitor.

9. The circuit of claim 8 wherein said differentiating means comprises a variable gain amplifier.

10. The circuit of claim 9 wherein said variable gain amplifier has a transfer function given by:

$$-K = \frac{-sK_1C}{g_{m2} + g_p + sC + sC_p}.$$

11. A circuit comprising:
    a first transconductance element receiving an input signal, said first transconductance element providing a first output signal at a first node;
    a first capacitor coupled between said first node and ground;
    a second transconductance element coupled to said first transconductance element at said first node for receiving said first output signal, said second transconductance element providing a second output signal at a second node;
    a third transconductance element coupled to said second transconductance element at said second node, said third transconductance element providing a third output signal, said third output signal coupled in a feedback loop to said first node;
    differentiating means coupled to said input signal, said differentiating means providing a fourth output signal coupled to said second node through a second capacitor.

12. The circuit of claim 11 wherein said differentiating means comprises:
    a fourth transconductance element providing a fifth output signal coupled to said input signal through a third capacitor, said fifth output signal coupled in a feedback loop to said fourth transconductance element;
    a fifth transconductance element providing a sixth output signal coupled to said fourth transconductance element;
    an amplifier coupled to said fifth output signal providing said fourth output signal.

13. The circuit of claim 11 wherein said differentiating means has a transfer function given by:

$$-K = \frac{-K_1 s C_1}{sC_1 + sC_{p1} + g_{p1} + g_{m1}}.$$

14. A circuit comprising:
a first transconductance element receiving an input signal, said first transconductance element providing a first output signal at a first node;
a first capacitor coupled between said first node and ground;
a second transconductance element coupled to said first transconductance element at said first node, said second transconductance element receiving said first output signal and providing a second output signal at a second node, said second output signal coupled in a feedback loop to said first transconductance element;
a differentiating means coupled to said input signal, said differentiating means providing a third output signal through a second capacitor to said second node.

15. The circuit of claim 14 wherein said differentiating means comprises:
a third transconductance element providing a fourth output signal at a third node, said third node coupled in a feedback loop to said third transconductance element, said third node coupled through a second capacitor to said input signal; and
amplifying means coupled to said third node providing said third output signal.

* * * * *